US009012973B2

(12) United States Patent
Ohashi et al.

(10) Patent No.: US 9,012,973 B2
(45) Date of Patent: Apr. 21, 2015

(54) SEMICONDUCTOR MEMORY DEVICE AND METHOD FOR MANUFACTURING THE SAME

(71) Applicant: Kabushiki Kaisha Toshiba, Minato-ku (JP)

(72) Inventors: Takuo Ohashi, Mie-ken (JP); Fumiki Aiso, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/096,323

(22) Filed: Dec. 4, 2013

(65) Prior Publication Data

US 2015/0048437 A1  Feb. 19, 2015

Related U.S. Application Data

(60) Provisional application No. 61/865,871, filed on Aug. 14, 2013.

(51) Int. Cl.
*H01L 29/788* (2006.01)
*H01L 21/28* (2006.01)

(52) U.S. Cl.
CPC ........ *H01L 29/788* (2013.01); *H01L 21/28273* (2013.01); *Y10S 257/914* (2013.01)

(58) Field of Classification Search
CPC ................... H01L 29/788; H01L 21/28273

USPC ........................................... 257/321, 261, 914
See application file for complete search history.

(56) References Cited

U.S. PATENT DOCUMENTS

| 6,455,890 | B1 * | 9/2002 | Chang et al. ................. 257/321 |
| 7,294,878 | B2 | 11/2007 | Tanaka et al. |
| 2004/0262651 | A1 * | 12/2004 | Mouli ............................ 257/290 |
| 2006/0014360 | A1 * | 1/2006 | Matsumoto .................... 438/424 |
| 2007/0272966 | A1 * | 11/2007 | Nishida et al. ................. 257/314 |
| 2008/0090352 | A1 * | 4/2008 | Lee et al. ........................ 438/257 |
| 2009/0108333 | A1 * | 4/2009 | Kito et al. ....................... 257/324 |
| 2010/0078622 | A1 * | 4/2010 | Yoshimizu et al. ............... 257/4 |
| 2011/0204433 | A1 | 8/2011 | Fujita et al. |
| 2013/0240970 | A1 * | 9/2013 | Kondo et al. ................... 257/316 |

* cited by examiner

*Primary Examiner* — Bilkis Jahan
(74) *Attorney, Agent, or Firm* — Oblon, McClelland, Maier & Neustadt, L.L.P.

(57) ABSTRACT

According to one embodiment, a semiconductor memory device includes an insulating film with a recess formed in an upper surface, and a conductive film provided on the insulating film and containing silicon, carbon and an impurity serving as an acceptor or donor for silicon. Carbon concentration of a first portion of the conductive film in contact with the insulating film is lower than carbon concentration of a second portion of the conductive film located in the recess and being equidistant from the insulating film placed on both sides thereof.

15 Claims, 10 Drawing Sheets

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 61/865,871, filed on Aug. 14, 2013; the entire contents of which are incorporated herein by reference.

FIELD

Embodiments described herein relate generally to a semiconductor memory device and a method for manufacturing the same.

BACKGROUND

Conventionally, as a semiconductor memory device, a NAND flash memory has been developed. As a NAND flash memory, a rocket-shaped memory has been proposed. In the rocket-shaped memory, the upper portion of the floating gate electrode is projected upward from the upper surface of the device isolation insulating film. An IPD (inter-poly dielectric) film is formed so as to cover this projected portion of the floating gate electrode, and a control gate electrode is provided thereon. Thus, the control gate electrode is inserted into the gap between the floating gate electrodes so that the floating gate electrode is surrounded from three directions. This can enhance the control power of the control gate electrode on the floating gate electrode.

However, the miniaturization of the NAND flash memory results in narrowing the gap between the floating gate electrodes. This decreases the embeddability of the control gate electrode and causes the problem of the generation of voids. If a void is generated in the control gate electrode, the potential fails to be sufficiently applied to the portion of the control gate electrode below the void. This decreases the reliability of the operation.

DETAILED DESCRIPTION

In general, according to one embodiment, a semiconductor memory device includes an insulating film with a recess formed in an upper surface, and a conductive film provided on the insulating film and containing silicon, carbon and an impurity serving as an acceptor or donor for silicon. Carbon concentration of a first portion of the conductive film in contact with the insulating film is lower than carbon concentration of a second portion of the conductive film located in the recess and being equidistant from the insulating film placed on both sides thereof.

In general, according to one embodiment, a method for manufacturing a semiconductor memory device includes depositing silicon on an insulating film with a recess formed in an upper surface while introducing carbon and an impurity serving as an acceptor or donor for silicon. In the depositing silicon, amount of introduction of carbon at a first time is smaller than amount of introduction of carbon at a second time later than the first time.

Embodiments of the invention will now be described with reference to the drawings.

First, a first embodiment is described.

The semiconductor memory device according to the embodiment is a NAND flash memory.

Figure 1:
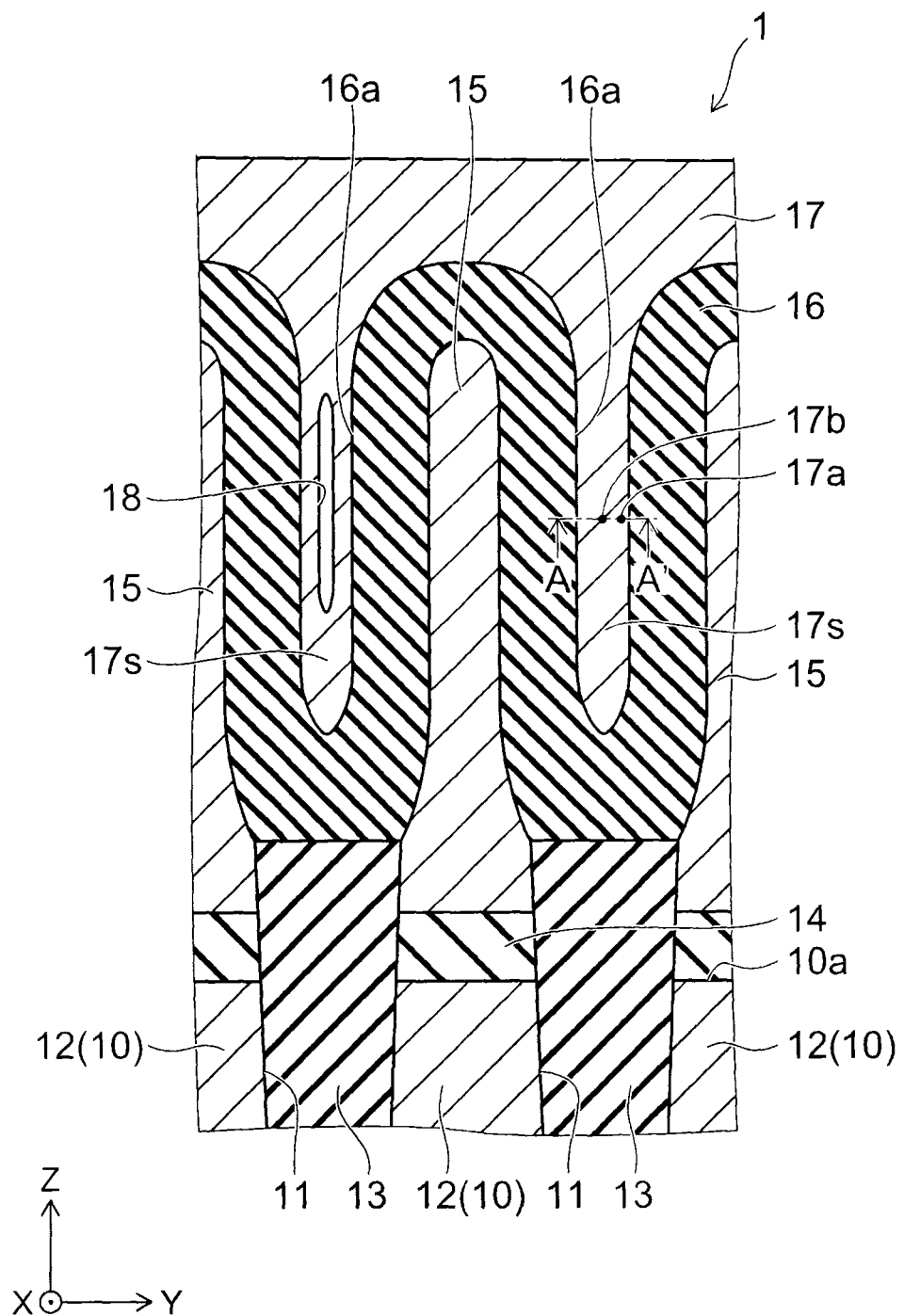
FIG. 1 is a sectional view illustrating a semiconductor memory device according to a first embodiment.

FIG. 1 is a sectional view illustrating a semiconductor memory device according to the embodiment.

Figure 2:
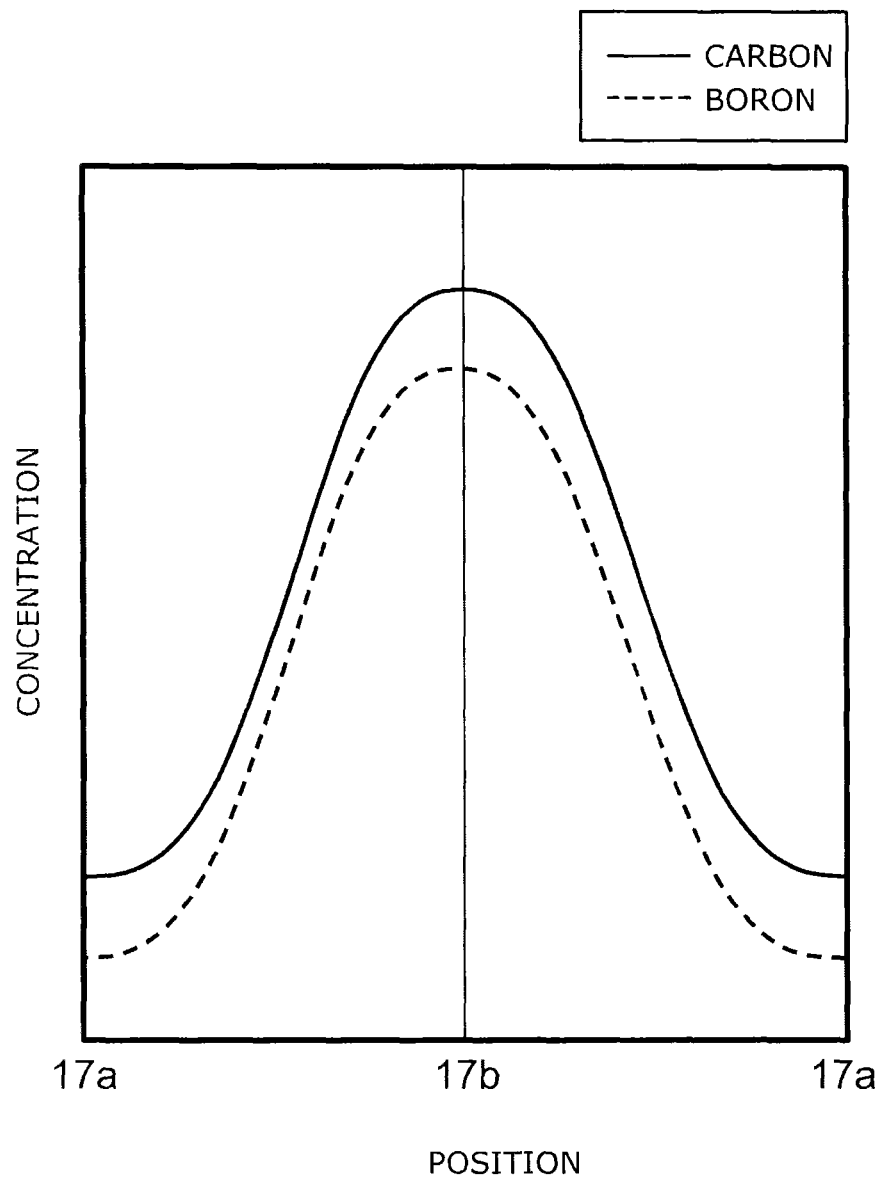
FIG. 2 is a graph illustrating the composition distribution of the control gate electrode, where the horizontal axis represents position along line A-A' of FIG. 1, and the vertical axis represents the concentration of carbon and boron.

FIG. 2 is a graph illustrating the composition distribution of the control gate electrode, where the horizontal axis represents position along line A-A' of FIG. 1, and the vertical axis represents the concentration of carbon and boron.

As shown in FIG. 1, the semiconductor memory device 1 (hereinafter also simply referred to as "device 1") according to the embodiment includes a silicon substrate 10. In the upper surface 10a of the silicon substrate 10, a plurality of trenches 11 extending in the X direction are formed. The portion partitioned by the trenches 11 in the upper portion of the silicon substrate 10 constitutes an active area 12.

On the silicon substrate 10, a plurality of device isolation insulators (STI) 13 are provided. Each STI 13 extends in the X direction. The lower part of the STI 13 is located in the trench 11. The upper part of the STI 13 is projected upward from the upper surface 10a of the silicon substrate 10.

Above the region of the upper surface 10a of the silicon substrate 10 where the trench 11 is not formed, a tunnel insulating film 14 is provided. The tunnel insulating film 14 is normally insulative. However, upon application of a prescribed voltage within the range of the driving voltage of the device 1, the tunnel insulating film 14 passes a tunnel current. For instance, the tunnel insulating film 14 is formed from silicon oxide.

On the tunnel insulating film 14, a plurality of floating gate electrodes 15 are provided. The floating gate electrode 15 is formed from a conductive material such as silicon containing impurity. The floating gate electrode 15 is placed directly above the active area 12. The floating gate electrodes 15 are arranged in a matrix along the X direction and the Y direction. The lower part of each floating gate electrode 15 is sandwiched between the STIs 13. The upper part of each floating gate electrode 15 is projected upward from the upper surface of the STI 13. Here, the X direction and the Y direction are directions being parallel to the upper surface 10a of the silicon substrate 10, and crossing (e.g., being orthogonal to) each other. The Z direction is a direction perpendicular to the upper surface 10a.

Above the STI 13 and the floating gate electrode 15, an IPD 16 as an insulating film is provided so as to cover the STI 13 and the floating gate electrode 15. The IPD 16 extends in the Y direction and covers the upper surface of the STI 13 and the portion of the floating gate electrode 15 projected from the upper surface of the STI 13. Thus, the cross section of the IPD 16 has a corrugated shape reflecting the shape of the floating gate electrodes 15 projected from the upper surface of the STI 13. That is, in the upper surface of the IPD 16, a plurality of recesses 16a sandwiched between the floating gate electrodes 15 adjacent in the Y direction are formed.

On the IPD 16, a conductive control gate electrode 17 is provided. The control gate electrode 17 extends in the Y direction and is inserted also into the recess 16a in the upper surface of the IPD 16. The control gate electrode 17 is composed primarily of silicon. At least part, e.g. all, of the control gate electrode 17 is crystallized into a polycrystal. The control gate electrode 17 contains an impurity, such as boron (B), serving as an acceptor or donor for silicon. Furthermore, the control gate electrode 17 contains carbon (C).

In the inserted portion 17s of the control gate electrode 17 inserted into the recess 16a of the IPD 16, a seam (air gap) 18 may be formed. However, the seam 18 does not reach the IPD 16.

As shown in FIGS. 1 and 2, the carbon concentration in the control gate electrode 17 is lowest at the interface with the IPD 16, and becomes higher with the distance from the IPD 16. Thus, in the recess 16a, the carbon concentration of the portion 17a of the control gate electrode 17 in contact with the IPD 16 is lower than the carbon concentration of the portion 17b equidistant from the IPDs 16 placed on both sides thereof. For instance, the carbon concentration of the control gate electrode 17 embedded in the recess 16a continuously increases from the portion 17a toward the portion 17b. In an example, the carbon concentration in the portion 17a is $5 \times 10^{20}/cm^3$ or more, and the carbon concentration in the portion 17b is $1 \times 10^{21}/cm^3$ or more.

The boron concentration in the control gate electrode 17 also becomes higher with the distance from the IPD 16 and continuously increases from the portion 17a toward the portion 17b. Thus, the boron concentration in the portion 17a is lower than the boron concentration in the portion 17b. The boron concentration in the control gate electrode 17 is e.g. approximately $5 \times 10^{20}$-$5 \times 10^{21}/cm^3$. The carbon concentration distribution and the boron concentration distribution in the control gate electrode 17 can be detected by e.g. SIMS (secondary ionization mass spectrometer).

Next, a method for manufacturing a semiconductor memory device according to the embodiment is described.

FIGS. 3A to 4B are process sectional views illustrating the method for manufacturing a semiconductor memory device according to the embodiment.

Figure 5A:
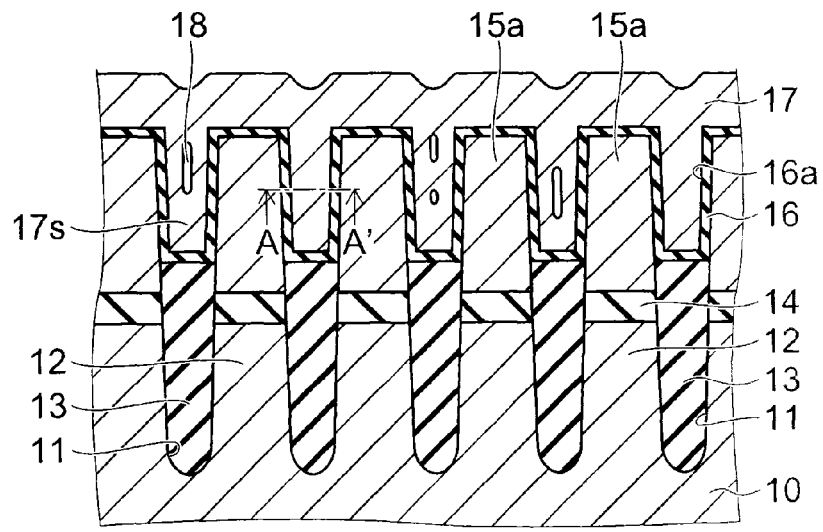
FIG. 5A is a process sectional view illustrating the method for manufacturing the semiconductor memory device according to a first embodiment.
Figure 5B:
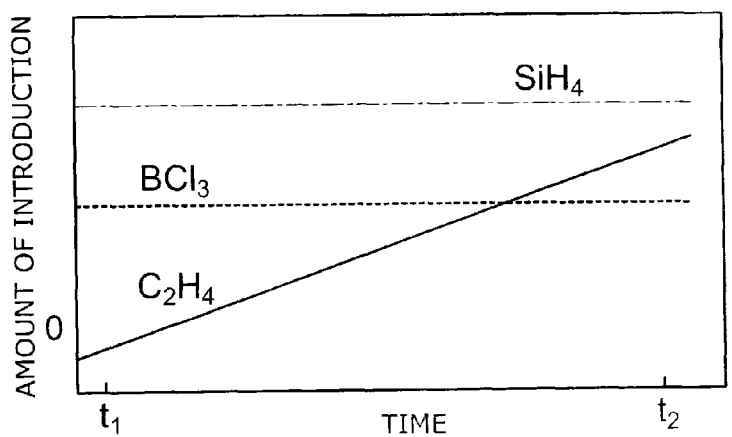
FIG. 5B is a graph illustrating the change of the amount of introduction of the raw material gas for depositing silicon, where the horizontal axis represents time, and the vertical axis represents the amount of introduction of the raw material gas.
Figure 5C:
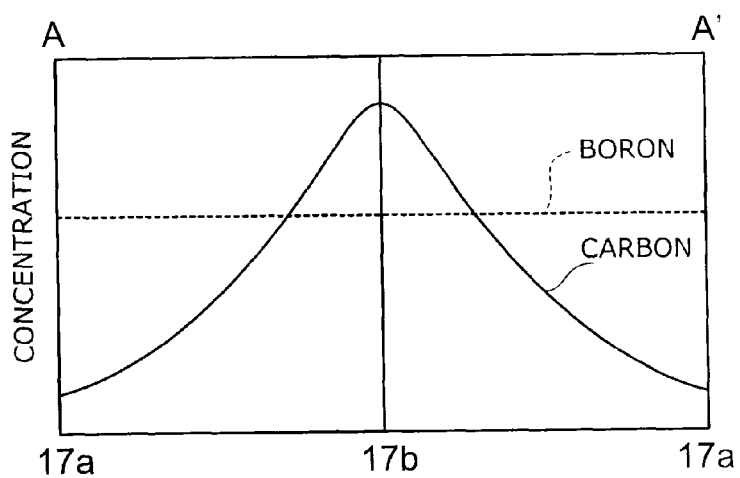
FIG. 5C is a graph illustrating the concentration profile along line A-A' shown in FIG. 5A, where the horizontal axis represents position, and the vertical axis represents concentration.

FIG. 5A is a process sectional view illustrating the method for manufacturing a semiconductor memory device according to the embodiment. FIG. 5B is a graph illustrating the change of the amount of introduction of the raw material gas for depositing silicon, where the horizontal axis represents time, and the vertical axis represents the amount of introduction of the raw material gas. FIG. 5C is a graph illustrating the concentration profile along line A-A' shown in FIG. 5A, where the horizontal axis represents position, and the vertical axis represents concentration.

Figure 6:
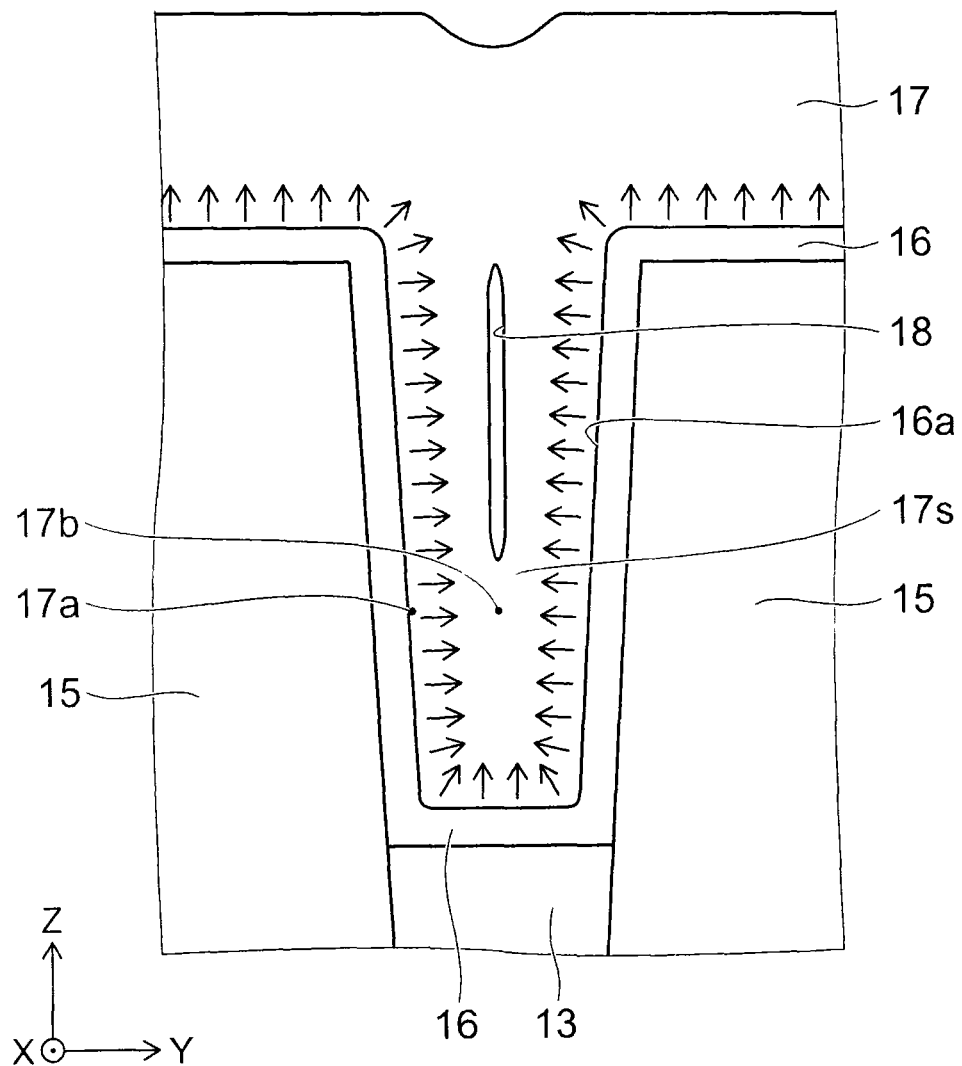
FIG. 6 is a process sectional view illustrating the crystallization of the amorphous silicon film.

FIG. 6 is a process sectional view illustrating the crystallization of the amorphous silicon film.

Figure 3A:
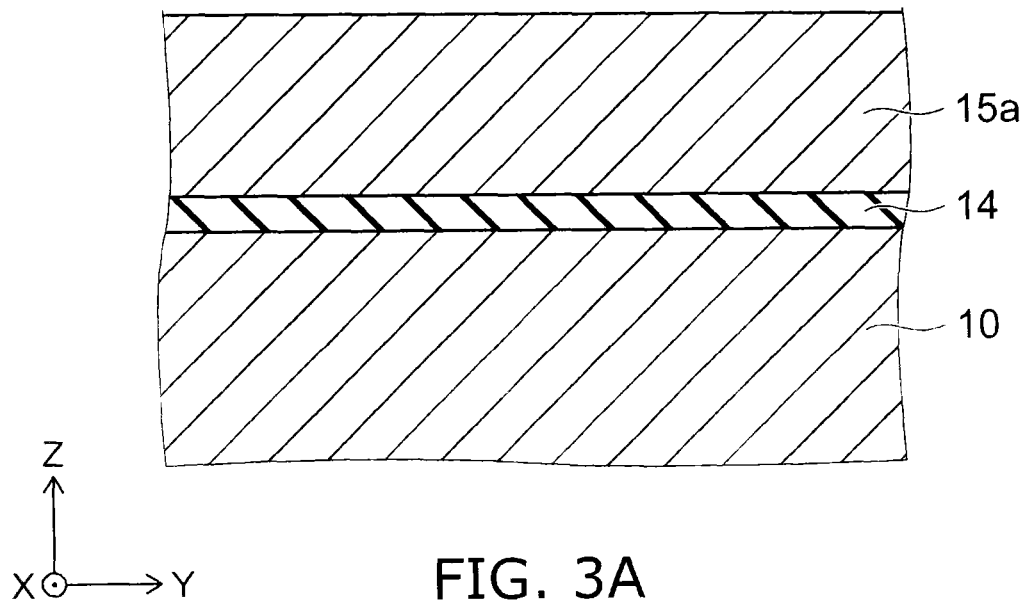
FIGS. 3A to 4B are process sectional views illustrating the method for manufacturing a semiconductor memory device according to the first embodiment.

First, as shown in FIG. 3A, a silicon substrate 10 is prepared. The silicon substrate 10 is e.g. a monocrystalline silicon wafer. Next, on the silicon substrate 10, a tunnel insulating film 14 made of e.g. silicon oxide or silicon oxynitride is formed. Next, on the tunnel insulating film 14, an amorphous silicon film 15a made of e.g. silicon doped with impurity is formed.

Figure 3B:
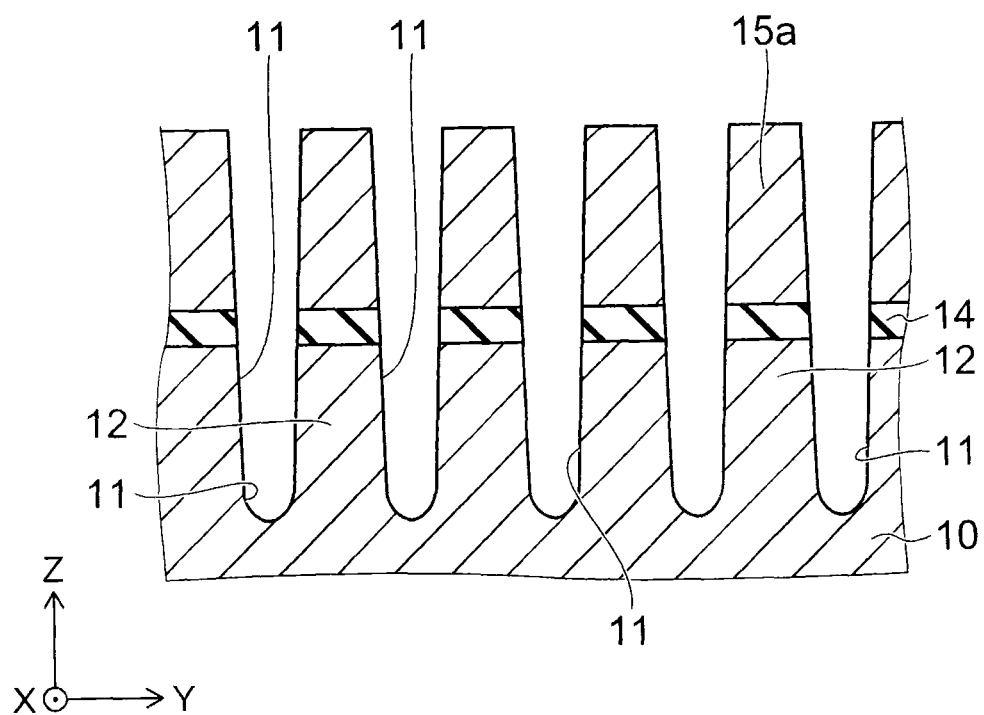

Next, as shown in FIG. 3B, patterning is performed by e.g. lithography technique. Thus, the amorphous silicon film 15a and the tunnel insulating film 14 are divided along the X direction, and trenches 11 extending in the X direction are formed in the upper surface 10a of the silicon substrate 10. Here, the portion partitioned by the trenches 11 in the upper portion of the silicon substrate 10 constitutes an active area 12.

Figure 4A:
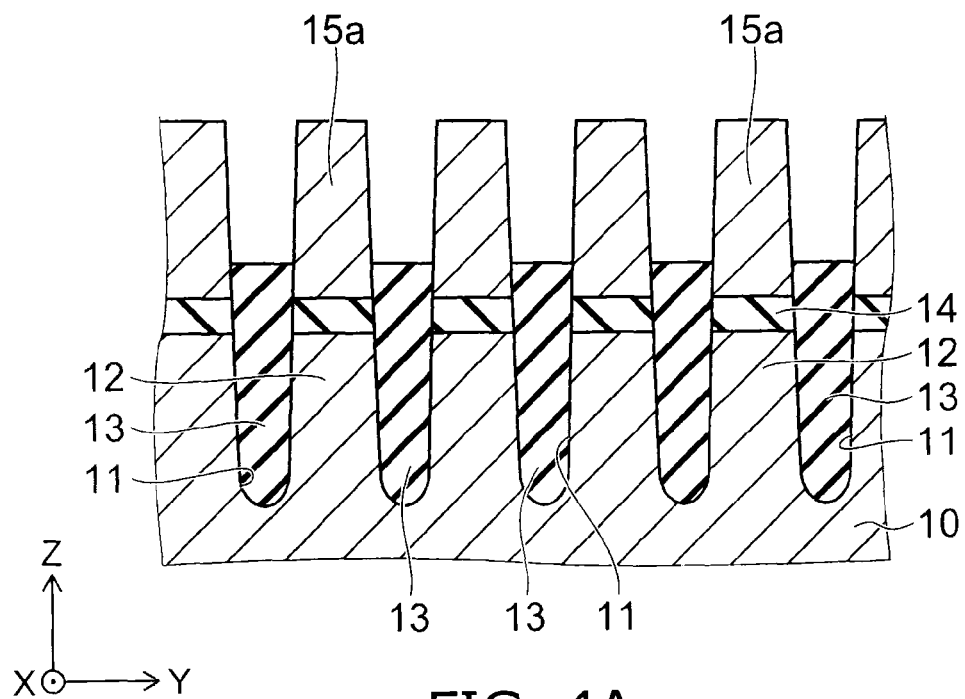

Next, as shown in FIG. 4A, silicon oxide is deposited on the entire surface, and the upper part thereof is removed. Thus, an STI 13 made of silicon oxide is formed between the divided tunnel insulating films 14 and between the lower parts of the divided amorphous silicon films 15a. The lower part of the STI 13 is embedded in the trench 11. The upper surface of the STI 13 is located below the upper surface of the amorphous silicon film 15a, and above the lower surface of the amorphous silicon film 15a.

Figure 4B:
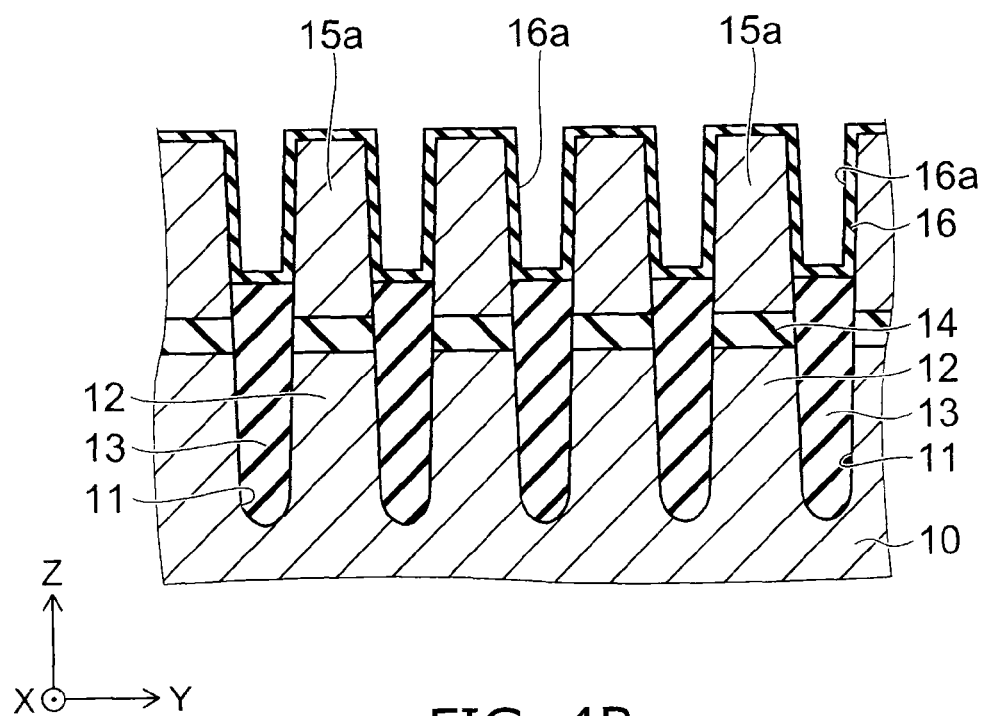

Next, as shown in FIG. 4B, for instance, silicon oxide or silicon oxynitride is deposited on the entire surface to form an IPD 16. The IPD 16 covers the divided amorphous silicon films 15a and the STI 13. Thus, the cross section of the IPD 16 has a corrugated shape reflecting the shape of the amorphous silicon films 15a projected from the upper surface of the STI 13. In the upper surface of the IPD 16, a recess 16a is formed in the region sandwiched between the amorphous silicon films 15a adjacent in the Y direction.

Next, as shown in FIG. 5A, on the IPD 16 formed in a corrugated shape, silicon is deposited while introducing carbon and an impurity, such as boron, serving as an acceptor or donor for silicon. For instance, silicon containing boron and carbon is deposited by CVD (chemical vapor deposition) technique with silane ($SiH_4$), boron trichloride ($BCl_3$), and ethylene ($C_2H_4$) used as a raw material gas. Thus, an amorphous silicon film 17c is formed.

At this time, if the embeddability of silicon is low, silicon is not completely embedded in the recess 16a, but a seam 18 may be formed in the inserted portion 17s of the amorphous silicon film 17c. The seam 18 is formed in the central portion nearly equidistant from the IPDs 16 on both sides thereof, and is spaced from the IPDs 16.

As shown in FIG. 5B, in this CVD process for depositing silicon, the amount of introduction of ethylene ($C_2H_4$) is continuously increased. Thus, the amount of introduction of ethylene at the time $t_1$ is made smaller than the amount of introduction of ethylene at the time $t_2$ later than the time $t_1$. Accordingly, the amount of introduction of carbon at the time $t_1$ is made smaller than the amount of introduction of carbon at the time $t_2$. On the other hand, the amount of introduction of silane ($SiH_4$) and boron trichloride ($BCl_3$) is set constant. Thus, the amount of deposition of silicon and the amount of introduction of boron are made constant.

As a result, as shown in FIG. 5C, in the inserted portion 17s of the amorphous silicon film 17c embedded in the recess 16a, the carbon concentration profile is a peak-shaped profile in which the central part, i.e., the portion 17b, is relatively high, and both side parts, i.e., the portions 17a, are relatively low. On the other hand, the boron concentration profile is a profile in which the concentration is nearly constant.

Next, heat treatment is performed. For instance, heating is performed at a temperature of 800-900° C. for 10-20 seconds. Alternatively, heating is performed at a temperature of 600-700° C. for 1 hour or more. Thus, the impurity introduced in the amorphous silicon film 15a and the amorphous silicon film 17c is activated, and the amorphous silicon film 15a and the amorphous silicon film 17c are crystallized. Accordingly, the amorphous silicon film 15a turns to a floating gate electrode 15 made of polycrystalline silicon, and the amorphous silicon film 17c turns to a control gate electrode 17 made of polycrystalline silicon. At this time, as shown in FIG. 2, in the amorphous silicon film 17c, boron is moved toward carbon. Thus, the boron concentration profile is shaped along the carbon concentration profile. That is, the boron concentration in the portion 17a is made lower than the boron concentration in the portion 17b.

At a high carbon concentration, silicon atoms in the amorphous silicon film 17c is not easily moved, and thus not easily crystallized. Accordingly, as shown in FIG. 6, in the amorphous silicon film 17c, crystallization proceeds from the portion having a relatively low carbon concentration, e.g., the portion 17a in contact with the IPD 16, toward the portion having a relatively high carbon concentration, e.g., the portion 17b. Thus, in the inserted portion 17s of the amorphous silicon film 17c, the seam 18 is confined in the neighborhood of the portion last crystallized, i.e., the portion 17b. Accordingly, the seam 18 does not spread significantly in the Y direction with the crystallization of the amorphous silicon film 17. Thus, the seam 18 can be prevented from reaching the IPD 16.

Next, as shown in FIG. 1, the control gate electrode 17, the IPD 16, and the floating gate electrode 15 are divided along the Y direction. Thus, the control gate electrode 17 and the IPD 16 are processed into strips extending in the Y direction, and the floating gate electrode 15 is processed into a matrix arranged along the X direction and the Y direction. Then, the upper wiring (not shown) and the like are formed, and diced for singulation. Thus, the semiconductor memory device 1 is manufactured.

Next, the function and effect of the embodiment are described.

In the semiconductor memory device 1, a memory cell including one floating gate electrode 15 is formed for each nearest portion of the active area 12 and the control gate electrode 17.

In the device 1, carbon is contained in the amorphous silicon film 17c. Thus, silicon atoms are not easily moved. This can suppress that the seam 18 formed in depositing the amorphous silicon film 17c is deformed into a spherical void by the subsequent heat treatment. As a result, this can prevent the spherical void from vertically dividing the inserted portion 17s of the control gate electrode 17, and can avoid the generation of a portion of the control gate electrode 17 where the potential is not sufficiently applied.

However, carbon contained in silicon decreases the activation ratio of the impurity such as boron, and decreases the conductivity of the control gate electrode 17. This may be compensated by increasing the boron concentration in the control gate electrode 17. However, this causes boron at high concentration to be in contact with the IPD 16. Then, the leakage current of the IPD 16 is increased, or fixed charge is generated in the IPD 16. This decreases the reliability of the IPD 16.

In contrast, in the embodiment, the carbon concentration in the amorphous silicon film 17c is inclined as shown in FIG. 2. More specifically, the carbon concentration is inclined so that the carbon concentration in the portion 17a near the interface with the IPD 16 is lower than the carbon concentration in the portion 17b equidistant from the IPDs 16 on both sides thereof in the recess 16a. Accordingly, when heat treatment is performed, boron in the amorphous silicon film 17c is moved toward carbon. Thus, the boron concentration profile is shaped along the carbon concentration profile. As a result, in the control gate electrode 17, the boron concentration is made lower near the interface with the IPD 16. This can ensure the reliability of the IPD 16. On the other hand, in the control gate electrode 17, the boron concentration is made higher in the portion spaced from the IPD 16. This can realize sufficient conductivity.

As shown in FIG. 6, by inclining the carbon concentration in the amorphous silicon film 17c, the crystallization of the amorphous silicon film 17c can be controlled so that the crystal grows in the direction away from the IPD 16 starting from the interface with the IPD 16. This can also confine the seam 18 in the central part in the Y direction in the recess 16a. Thus, the control gate electrode 17 can be prevented more reliably from being divided by the seam 18.

Furthermore, in the embodiment, as shown in FIG. 5B, when the amorphous silicon film 17c is deposited, the amount of introduction of boron trichloride ($BCl_3$) serving as a raw material gas of boron is set constant. Thus, the amount of introduction of boron is set constant. Accordingly, even if the width of the recess 16a is varied due to the variation of the process condition, the boron concentration of the inserted portion 17s of the amorphous silicon film 17c embedded in the recess 16a can be set constant. As a result, even if boron is moved by heat treatment, the average concentration of boron can be set constant among a plurality of inserted portions 17s. This can prevent the conductivity of the control gate electrode 17 from varying among the inserted portions 17s. This effect is particularly significant in the case where the width of the recess 16a is narrowed with the miniaturization of the semiconductor memory device 1.

As shown in FIG. 5B, the amount of introduction of ethylene ($C_2H_4$) serving as a raw material gas of carbon is continuously increased. Thus, if the width of the recess 16a is varied due to the variation of the process condition, the average carbon concentration is varied among the inserted portions 17s. However, carbon is an element added to suppress the deformation of the seam 18, and not an element directly affecting the conductivity of the control gate electrode 17. Thus, this variation causes no practical problem.

In the embodiment, in the amorphous silicon film 17, the carbon concentration is continuously changed. Thus, even if the width of the recess 16a is varied, the average carbon concentration of the inserted portion 17s is not significantly varied.

Next, a comparative example of the embodiment is described.

Figure 7:
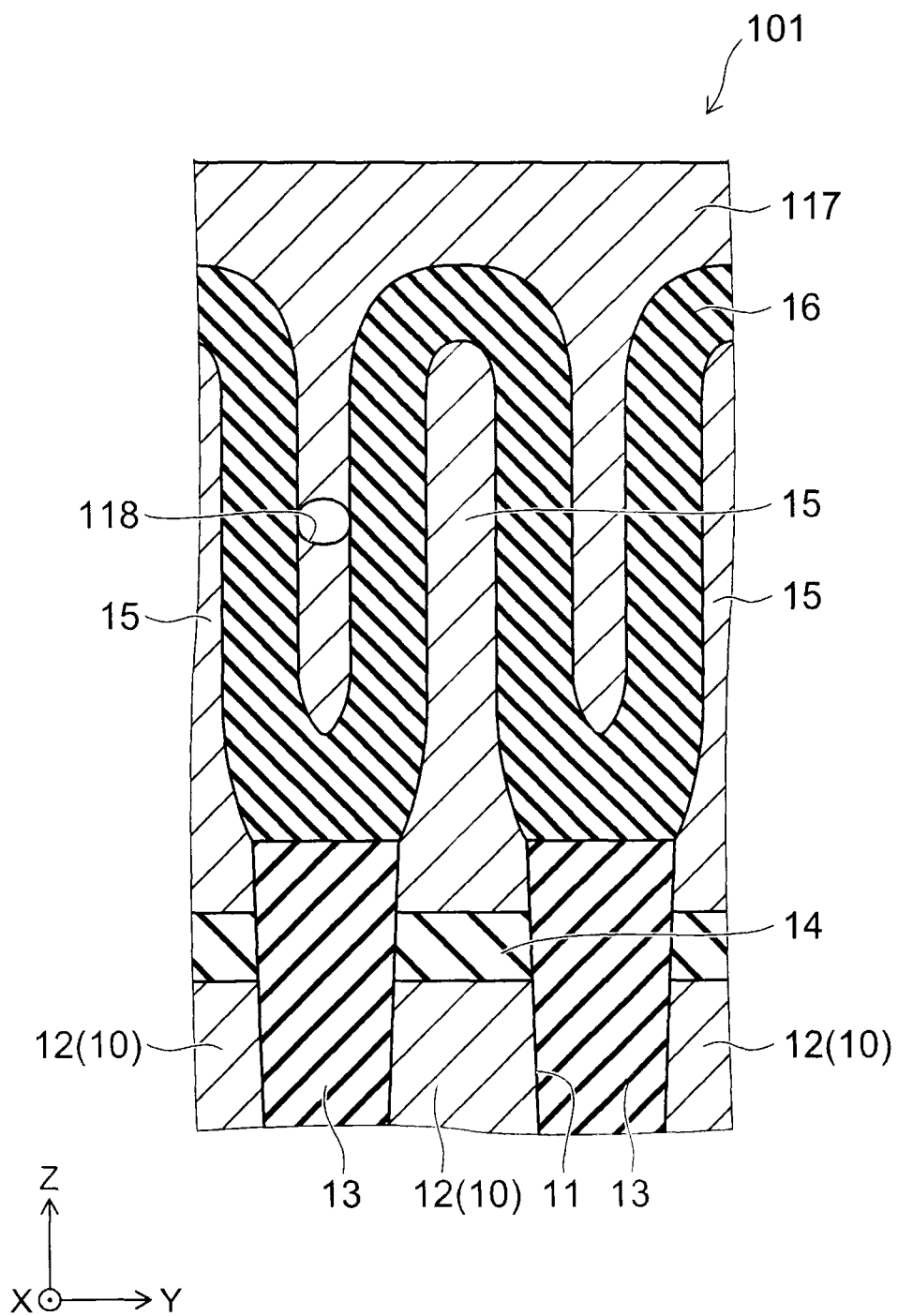
FIG. 7 is a sectional view illustrating a semiconductor memory device according to a comparative example.

FIG. 7 is a sectional view illustrating a semiconductor memory device according to this comparative example.

As shown in FIG. 7, the semiconductor memory device 101 according to this comparative example is different from the device 1 (see FIG. 1) according to the above embodiment in that a control gate electrode 117 is provided instead of the control gate electrode 17. The control gate electrode 117 is formed from silicon containing boron, but not containing carbon. Furthermore, in the control gate electrode 117, a generally spherical void 118 is formed. The void 118 reaches the IPD 16.

The method for manufacturing a semiconductor memory device according to this comparative example is similar to that of the above embodiment except for not introducing carbon in forming an amorphous silicon film 17c. In this comparative example, the amorphous silicon film 17c is not doped with carbon. Thus, in heat treatment, the seam 18 is deformed into a spherical void 118. The void 118 may reach the IPD 16. In the case where the width of the recess 16a is small, the void 118 may reach the IPDs 16 on both sides thereof.

In the device 101 according to this comparative example, a generally spherical void 118 is formed in the control gate electrode 117. Thus, in the recess 16a, the control gate electrode 117 may be vertically divided. In this case, in this memory cell, the control power of the control gate electrode 117 on the floating gate electrode 15 and the active area 12 is weakened. This increases the possibility of the occurrence of malfunctions.

In contrast, in the device 1 (see FIG. 1) according to the above embodiment, carbon is contained in the amorphous silicon film 17c. Thus, there is no case where the seam 18 is deformed and its width is increased. This can suppress division of the control gate electrode 17.

Figure 8:
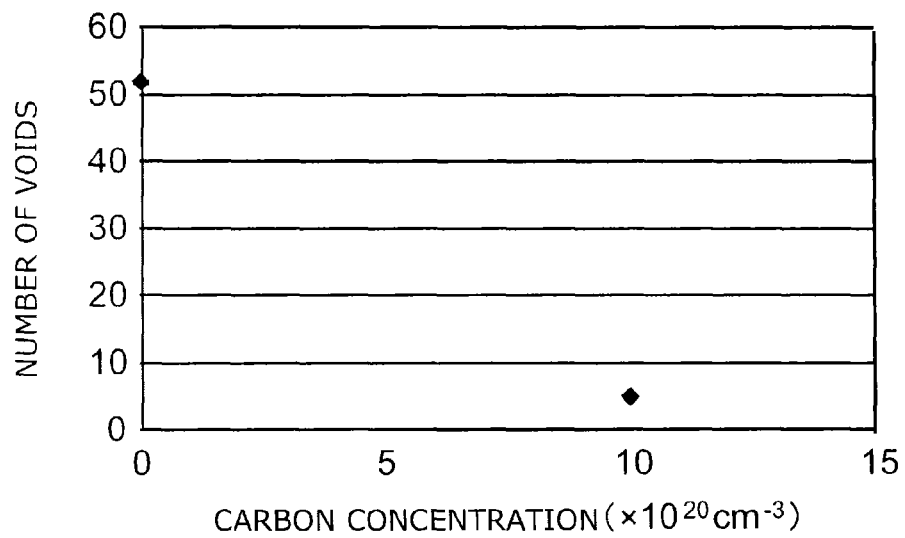
FIG. 8 is a graph illustrating the influence of the carbon concentration on the number of generated voids, where the horizontal axis represents the average carbon concentration in the control gate electrode, and the vertical axis represents the number of voids observed in a given region.

FIG. 8 is a graph illustrating the influence of the carbon concentration on the number of generated voids, where the horizontal axis represents the average carbon concentration in the control gate electrode, and the vertical axis represents the number of voids observed in a given region.

As shown in FIG. 8, in the case where the amorphous silicon film was not doped with carbon, 52 voids 118 were observed in the given region. However, in the case where the amorphous silicon film was doped with carbon at an average concentration of $1\times10^{21}/cm^3$, the number of voids 118 observed in the given region was 5. Thus, by introducing carbon in the amorphous silicon film constituting the control gate electrode 17, the generation of voids 118 can be suppressed.

Next, a second embodiment is described.

Figure 9:
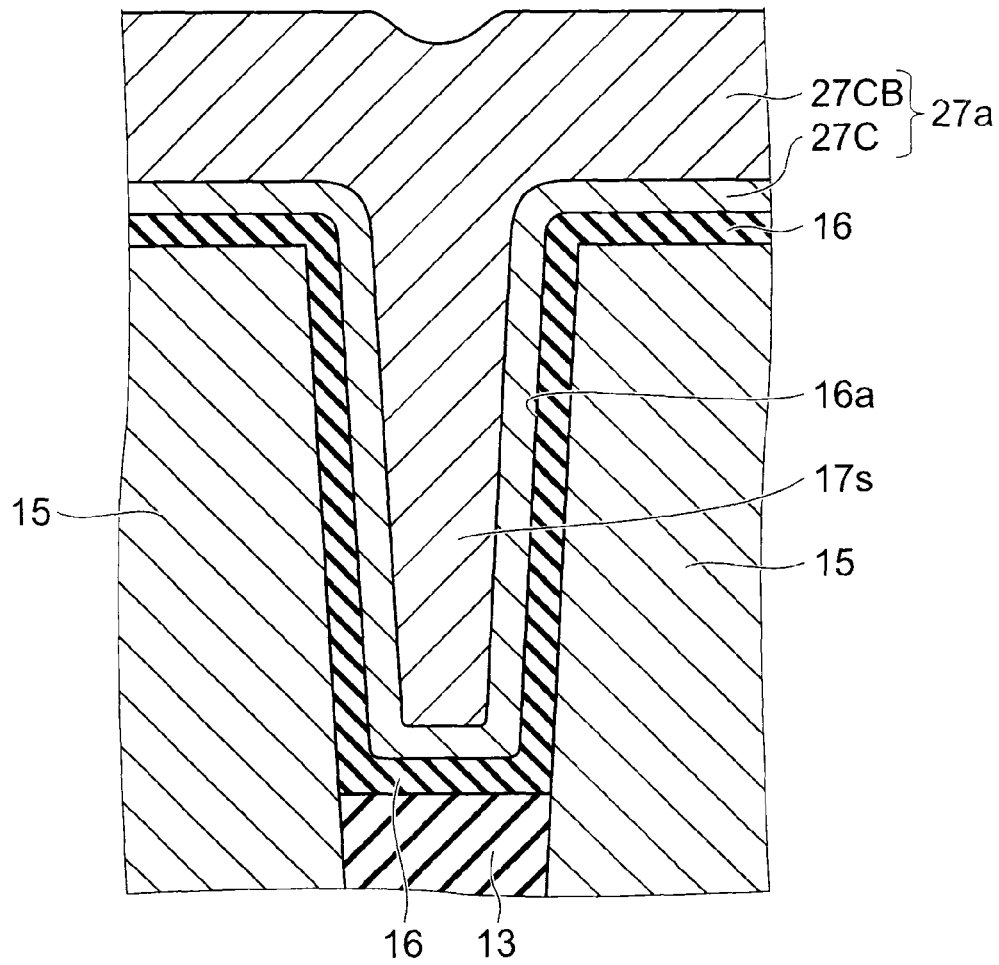
FIG. 9 is a process sectional view illustrating a method for manufacturing a semiconductor memory device according to a second embodiment.

FIG. 9 is a process sectional view illustrating a method for manufacturing a semiconductor memory device according to the embodiment.

As shown in FIG. 9, the method for manufacturing a semiconductor memory device according to the embodiment is different from the method for manufacturing a semiconductor memory device according to the above first embodiment in that the amorphous silicon film 27a has a two-layer structure. More specifically, in forming the amorphous silicon film 27a, first, a carbon-containing silicon layer 27C containing carbon and not containing boron is formed. Next, a carbon-boron-containing silicon layer 27CB containing both carbon and boron is formed. Then, by performing heat treatment, boron is diffused and activated. Thus, a control gate electrode is formed.

Also according to the embodiment, in the control gate electrode, the boron concentration of the portion in contact with the IPD 16 can be made lower to ensure the reliability of the IPD 16. On the other hand, the boron concentration of the portion spaced from the IPD 16 can be made higher to ensure the conductivity.

According to the embodiment, compared with the above first embodiment, the boron concentration of the portion of the control gate electrode 17 in contact with the IPD 16 can be decreased more reliably to further improve the reliability of the IPD 16.

On the other hand, according to the above first embodiment, compared with the embodiment, there is an advantage that even if the width of the recess 16a is varied due to process variation, the average boron concentration of the portion of the control gate electrode 17 embedded in the recess 16a is not varied.

More specifically, in the embodiment, the variation of the width of the recess 16a is directly reflected on the thickness of the carbon-boron-containing silicon layer 27CB. The variation of the thickness of the carbon-boron-containing silicon layer 27CB directly leads to the variation of the total amount of boron introduced in the inserted portion 17s. On the other hand, even if the width of the recess 16a is varied, the thickness of the carbon-containing silicon layer 27C not containing boron is not varied. Thus, if the width of the recess 16a is varied, the average boron concentration of the inserted portion 17s embedded in this recess 16a is significantly varied. As a result, due to the variation of the width of the recess 16a, the characteristic of the memory cell is easily varied. In contrast, according to the first embodiment, the amount of introduction of boron is set constant. Thus, even if the width of the recess 16a is varied, the average concentration of boron in the inserted portion 17s is not varied. Thus, the characteristic of the memory cell is stabilized with respect to the variation of the width of the recess 16a.

The configuration, manufacturing method, and function and effect of the embodiment other than the foregoing are similar to those of the above first embodiment.

Next, a third embodiment is described.

Figure 10A:
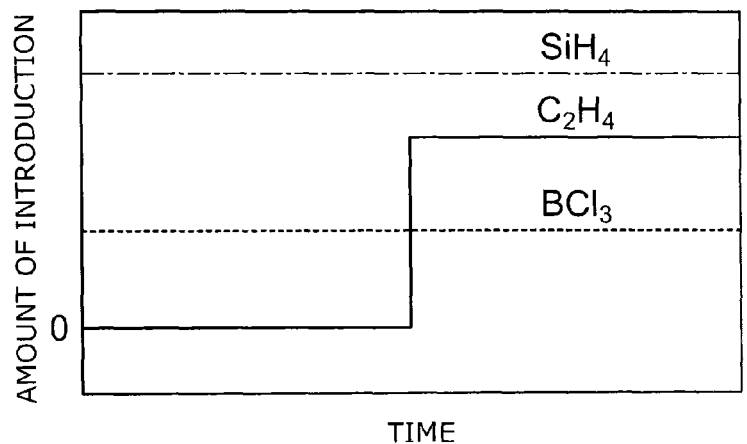
FIG. 10A is a graph illustrating the change of the amount of introduction of the raw material gas in depositing silicon in a third embodiment, where the horizontal axis represents time, and the vertical axis represents the amount of introduction of the raw material gas.
Figure 10B:
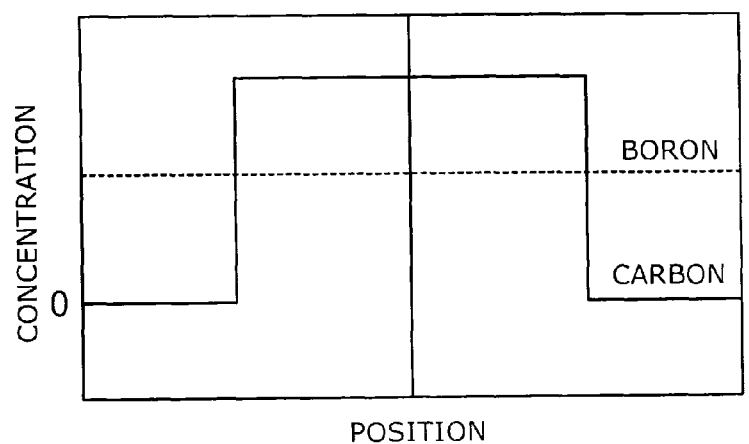
FIGS. 10B and 10C are graphs illustrating the concentration profile of boron and carbon, where the horizontal axis represents position, and the vertical axis represents concentration.
Figure 10C:
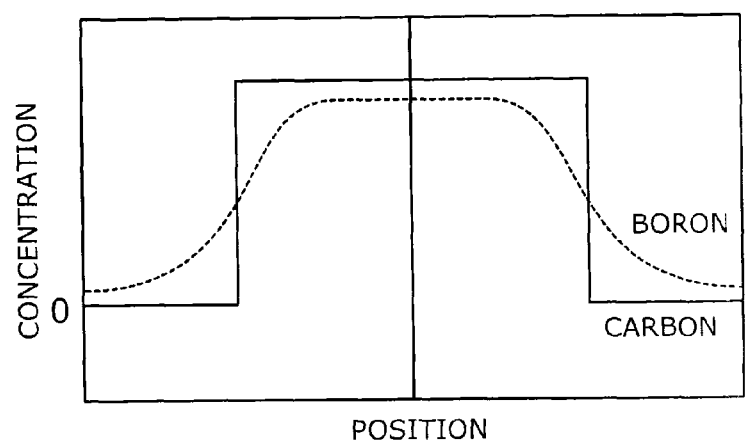

FIG. 10A is a graph illustrating the change of the amount of introduction of the raw material gas in depositing silicon in the embodiment, where the horizontal axis represents time, and the vertical axis represents the amount of introduction of the raw material gas. FIGS. 10B and 10C are graphs illustrating the concentration profile of boron and carbon, where the horizontal axis represents position, and the vertical axis represents concentration. FIG. 10B shows the profile in the amorphous silicon film before heat treatment. FIG. 10C shows the profile in the control gate electrode after heat treatment. The position represented on the horizontal axis of FIGS. 10B and 10C corresponds to the position along line A-A' shown in FIG. 5A.

As shown in FIG. 10A, in the embodiment, when the amorphous silicon film is formed by CVD technique, the amount of introduction of silane ($SiH_4$) and ethylene ($C_2H_4$) is set constant. Boron trichloride ($BCl_3$) is not introduced immediately after starting film formation, but introduced in a constant amount from halfway. That is, the amount of introduction of boron trichloride ($BCl_3$) is discontinuously increased.

Thus, as shown in FIG. 10B, in the amorphous silicon film immediately after film formation, a layer not doped with carbon is formed in the portion in contact with the IPD 16, and a layer doped with carbon is formed in the portion spaced from the IPD 16. Furthermore, as shown in FIG. 10C, in the control gate electrode after heat treatment, activation of boron, and crystallization of silicon, the concentration profile of carbon is scarcely changed. However, the concentration profile of boron is changed so as to approach the profile of carbon.

Next, the function and effect of the embodiment are described.

Figure 11A:
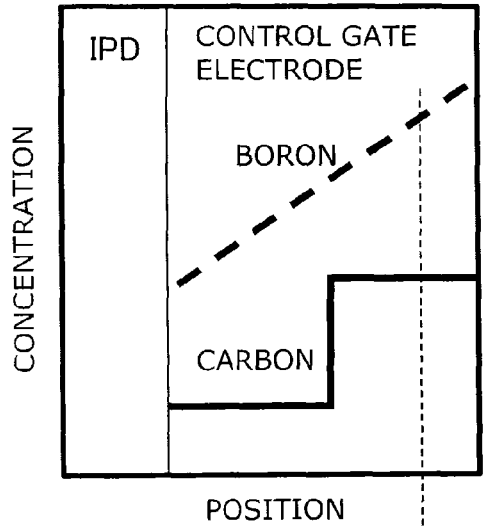
FIGS. 11A to 11D are graphs illustrating the concentration profile of carbon and boron in the control gate electrode, where the horizontal axis represents position, and the vertical axis represents concentration.
Figure 11C:
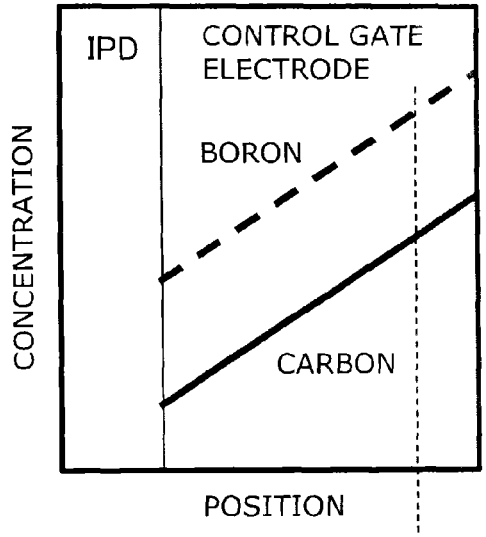
Figure 11B:
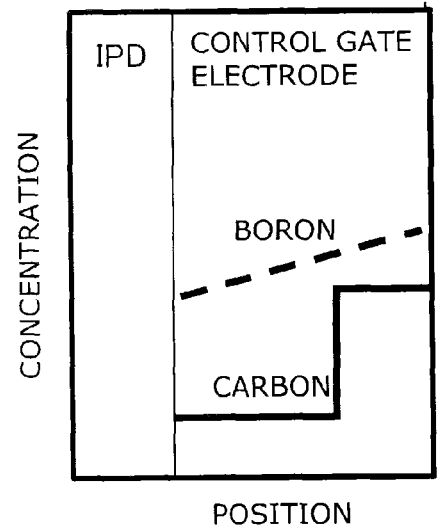
Figure 11D:
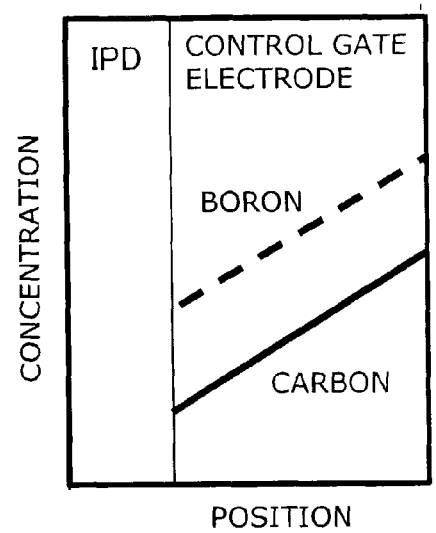

FIGS. 11A to 11D are graphs illustrating the concentration profile of carbon and boron in the control gate electrode, where the horizontal axis represents position, and the vertical axis represents concentration. FIGS. 11A and 11B show the embodiment. FIGS. 11C and 11D show the first embodiment. FIGS. 11A and 11C show the case where the width of the recess 16a is relatively wide. FIGS. 11B and 11D show the case where the width of the recess 16a is relatively narrow.

Also according to the embodiment, in the control gate electrode 17, the boron concentration of the portion in contact with the IPD 16 can be made lower to ensure the reliability of the IPD 16. On the other hand, the boron concentration of the portion spaced from the IPD 16 can be made higher to ensure the conductivity.

According to the embodiment, compared with the above first embodiment, the boron concentration of the portion of the control gate electrode 17 in contact with the IPD 16 can be decreased more reliably to suppress the leakage current more effectively.

Furthermore, compared with the above second embodiment, even if the width of the recess 16a is varied, the average concentration of boron in the control gate electrode can be kept constant. Thus, the characteristic of the memory cell can be stabilized.

On the other hand, as shown in FIGS. 11A and 11B, in the embodiment, in forming the amorphous silicon film 17c, the amount of introduction of carbon is discontinuously increased. Thus, if the width of the recess 16a is varied due to process variation, the concentration profile of carbon is significantly varied. Thus, the concentration inclination of boron after diffusion by heat treatment is also varied. Accordingly, the characteristic of the memory cell is easily varied.

In contrast, as shown in FIGS. 11C and 11D, according to the above first embodiment, in forming the amorphous silicon film 17c, the amount of introduction of carbon is continuously increased. Thus, even if the width of the recess 16a is varied due to process variation, the concentration inclination of carbon can be set constant. Accordingly, the concentration inclination of boron after diffusion by heat treatment can also be set constant. Thus, the characteristic of the memory cell is stable against the variation of the recess 16a.

In the examples illustrated in the above embodiments, boron is used as an impurity for imparting conductivity to silicon forming the control gate electrode. However, the impurity is not limited thereto, but may be e.g. phosphorus (P) or arsenic (As).

The embodiments described above can realize a semiconductor memory device and a method for manufacturing the same suitable for miniaturization.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
    an insulating film with a recess formed in an upper surface; and
    a conductive film provided on the insulating film and containing silicon, carbon and an impurity serving as an acceptor or donor for silicon,
    carbon concentration of a first portion of the conductive film in contact with the insulating film being lower than carbon concentration of a second portion of the conductive film located in the recess and being equidistant from the insulating film placed on both sides thereof.

2. The device according to claim 1, wherein carbon concentration of the conductive film continuously increases from the first portion toward the second portion.

3. The device according to claim 1, wherein concentration of the impurity in the first portion is lower than concentration of the impurity in the second portion.

4. The device according to claim 1, wherein the impurity is boron.

5. The device according to claim 1, further comprising:
    a semiconductor substrate in which a trench extending in a first direction is formed in an upper surface;
    a device isolation insulator with at least a lower part thereof located in the trench;
    a tunnel insulating film provided on the semiconductor substrate; and
    floating gate electrodes provided on the tunnel insulating film and arranged in a matrix along the first direction and a second direction crossing the first direction, with at least an upper part thereof projected upward from an upper surface of the device isolation insulator,
    wherein the insulating film extends in the second direction and covers a portion of the floating gate electrode projected from the upper surface of the device isolation insulator, and
    the conductive film is a control gate electrode.

6. The device according to claim 1, wherein at least part of the silicon forming the conductive film is crystallized.

7. The device according to claim 1, wherein a seam not reaching the insulating film is formed in a portion of the conductive film located in the recess.

8. A method for manufacturing a semiconductor memory device, comprising:
    depositing silicon on an insulating film with a recess formed in an upper surface while introducing carbon and an impurity serving as an acceptor or donor for silicon,
    in the depositing silicon, amount of introduction of carbon at a first time being smaller than amount of introduction of carbon at a second time later than the first time.

9. The method according to claim 8, wherein in the depositing silicon, the amount of introduction of carbon is continuously increased.

10. The method according to claim 8, wherein in the depositing silicon, amount of introduction of the impurity is set constant.

11. The method according to claim 8, wherein the impurity is boron.

12. The method according to claim 8, further comprising:
    forming a tunnel insulating film and a first film in this order on a semiconductor substrate;
    dividing the first film and the tunnel insulating film along a first direction and forming a trench extending in the first direction in an upper surface of the semiconductor substrate;
    forming a device isolation insulator so that at least a lower part thereof is embedded in the trench and an upper surface is located below an upper surface of the first film;
    forming the insulating film so as to cover the divided first film; and dividing a second film formed by the depositing silicon, the insulating film, and the first film along a second direction crossing the first direction.

13. The method according to claim 8, further comprising: performing heat treatment after the depositing silicon.

14. The method according to claim 13, wherein the impurity is activated by the heat treatment.

15. The method according to claim 13, wherein the silicon is crystallized by the heat treatment.

* * * * *